(12) United States Patent
Musket et al.

(10) Patent No.: US 6,507,033 B1
(45) Date of Patent: Jan. 14, 2003

(54) VERSATILE, HIGH-SENSITIVITY FARADAY CUP ARRAY FOR ION IMPLANTERS

(75) Inventors: Ronald G. Musket, Danville, CA (US); Robert G. Patterson, Dublin, CA (US)

(73) Assignee: The Regents of the University of California, Oakland, CA (US)

(*) Notice: Subject to any disclaimer, the term of this patent is extended or adjusted under 35 U.S.C. 154(b) by 0 days.

(21) Appl. No.: 09/280,231

(22) Filed: Mar. 29, 1999

(51) Int. Cl.$^7$ .............................................. H01J 37/317
(52) U.S. Cl. .................................. 250/492.21; 250/397
(58) Field of Search ............................. 250/397, 492.2, 250/492.21

(56) References Cited

U.S. PATENT DOCUMENTS

| | | | |
|---|---|---|---|
| 4,608,493 A | * | 8/1986 | Hayafuji |
| 4,628,209 A | * | 12/1986 | Wittkower |
| 4,724,324 A | * | 2/1988 | Liebert |
| 4,751,393 A | * | 6/1988 | Corey, Jr. et al. |
| RE33,193 E | * | 4/1990 | Yamaguchi et al. |
| 4,939,371 A | * | 7/1990 | Goto |
| 5,343,047 A | * | 8/1994 | Ono et al. |
| 5,472,231 A | * | 12/1995 | Crook et al. |
| 5,572,038 A | * | 11/1996 | Sheng et al. |
| 5,744,812 A | * | 4/1998 | Oh et al. |
| 6,207,964 B1 | * | 3/2001 | McIntyre et al. ........ 250/492.1 |

* cited by examiner

*Primary Examiner*—Kiet T. Nguyen
(74) *Attorney, Agent, or Firm*—L. E. Carnahan; Alan H. Thompson

(57) ABSTRACT

An improved Faraday cup array for determining the dose of ions delivered to a substrate during ion implantation and for monitoring the uniformity of the dose delivered to the substrate. The improved Faraday cup array incorporates a variable size ion beam aperture by changing only an insertable plate that defines the aperture without changing the position of the Faraday cups which are positioned for the operation of the largest ion beam aperture. The design enables the dose sensitivity range, typically $10^{11}$–$10^{18}$ ions/cm$^2$ to be extended to below $10^6$ ions/cm$^2$. The insertable plate/aperture arrangement is structurally simple and enables scaling to aperture areas between <1 cm$^2$ and >750 cm$^2$, and enables ultra-high vacuum (UHV) applications by incorporation of UHV-compatible materials.

18 Claims, 3 Drawing Sheets

VERSATILE, HIGH-SENSITIVITY FARADAY CUP ARRAY FOR ION IMPLANTERS

The United States Government has rights in this invention pursuant to Contract No. W-7405-ENG48 between the United States Department of Energy and the University of California for the operation of Lawrence Livermore National Laboratory.

BACKGROUND OF THE INVENTION

The present invention relates to Faraday cups, particularly to Faraday cup arrays for monitoring ion beam implantation, and more particularly to an improved Faraday cup array by extending the sensitivity range to below $10^6$ ions/cm$^2$, having an insertable plate in the aperture whereby the aperture area is scaleable to between <1 cm$^2$ to >750 cm$^2$, and enabling ultra-high vacuum applications.

For ion implanters, a Faraday cup assembly or array is commonly used for determining the dose of ions (i.e., ions/cm$^2$) delivered to a substrate and for monitoring the uniformity of the dose delivered to substrates. Typically, this assembly consists of four Faraday cups located at the corners of the ion beam raster pattern (e.g. square or rectangular) and includes an aperture that allows a central region of the raster pattern to be projected onto the substrate. A commercially available Faraday cup assembly is schematically illustrated in FIG. 1 and described in greater detail hereinafter. The assembly as shown in FIG. 1 includes a movable Faraday flag which allows setup of the implantation conditions while precluding implantation of the wafers or substrates mounted on a research cube. The flag is placed into the implant position to allow the projection of the scanned area onto the wafers or substrates. Prior Faraday cup assemblies or arrays were designed to perform well for ion doses of $10^{11}$–$10^{18}$ ions/cm$^2$. In addition, commercially available Faraday cup assemblies are designed with a single projection aperture size for each assembly. While this is desirable for high-dose implantations, it is not necessary for low-dose implantations. Also, existing Faraday cup assemblies are quite complicated, not easily scaleable to larger aperture areas, and not compatible with ultra-high vacuum (UHV) applications. Thus, there is a need in the art for a structurally simple, easily scaleable Faraday cup assembly or array that is also UHV compatible.

The present invention provides a solution to the above-mentioned need by providing an improved Faraday cup assembly which extends the typical prior sensitivity of from $10^{11}$–$10^{18}$ ions/cm$^2$ down to below $10^6$ ions/cm$^2$; provides for varying the aperture size without changing the positions of the Faraday cups, which are selected for the operation of the largest aperture; enables the aperture area to be easily scaleable between <1 cm$^2$ and >750 cm$^2$; and incorporates UHV-compatible materials in a versatile mounting structure.

SUMMARY OF THE INVENTION

It is an object of the present invention to provide an improved Faraday cup assembly for ion beam implantation applications.

A further object of the invention is to provide a Faraday cup assembly which extends the sensitivity range to be $10^6$ ions/cm$^2$.

A further object of the invention is to provide a Faraday cup assembly having an aperture area scaleable between <1 cm$^2$ to >750 cm$^2$.

Another object of the invention is to provide an improved Faraday cup assembly for an ion implanter wherein the sensitivity range is extended, the aperture area can be varied, and is constructed of materials compatible with ultra-high vacuum (UHV) applications.

Another object of the invention is to provide an improved Faraday cup assembly for ion implantation which utilized an insertable plate that defines the aperture, whereby the aperture area can be varied by simply changing the insertable plate.

Other objects and advantages of the present invention will become apparent to those skilled in the art from the following description and accompanying drawings. The present invention is a versatile, high sensitivity Faraday cup array or assembly for ion implantation. The assembly of this invention extends the sensitivity of prior assemblies of $10^{11}$–$10^{18}$ ions/cm$^2$, to below $10^6$–$10^{18}$ ions/cm$^2$ and provides a structurally simple, easily scaleable aperture area of between <1 cm$^2$ and >750 cm$^2$, and incorporates UHV-compatible materials. The present invention allows for varying the aperture size by changing only an insertable plate that defines the aperture without changing the positions of the Faraday cups, which are selected for the operation of the largest aperture. By a unique design and selection of materials, the present invention extends the sensitivity to below $10^6$ ions/cm$^2$, and enables UHV applications. Thus, the versatile, high sensitivity Faraday cup array or assembly of the present invention can more effectively be utilized for dosimetry and uniformity measurements during ion implantation or electron irradiation of materials.

BRIEF DESCRIPTION OF THE DRAWINGS

The accompanying drawings, which are incorporated into and form a part of the disclosure, illustrate an embodiment of the invention and, together with the description, serve to explain the principles of the invention.

DETAILED DESCRIPTION OF THE INVENTION

The present invention is directed to a versatile, high-sensitivity Faraday cup array, particularly for dose measurement and uniformity monitoring during ion beam implantation. The present invention extends the prior sensitivity range of $10^{11}$–$10^{18}$ ions/cm$^2$ to below $10^6$ ions/cm$^2$, while providing an aperture area that can be varied between <1 cm$^2$ to >750 cm$^2$, and incorporates materials which enables it to operate in ultra-high vacuum (UHV) applications. In addition the present invention is structurally simple and the aperture area can be varied by changing only an insertable plate that defines the aperture without changing the positions of the Faraday cups, which are placed to allow operation using the maximum required aperture.

Figure 1:
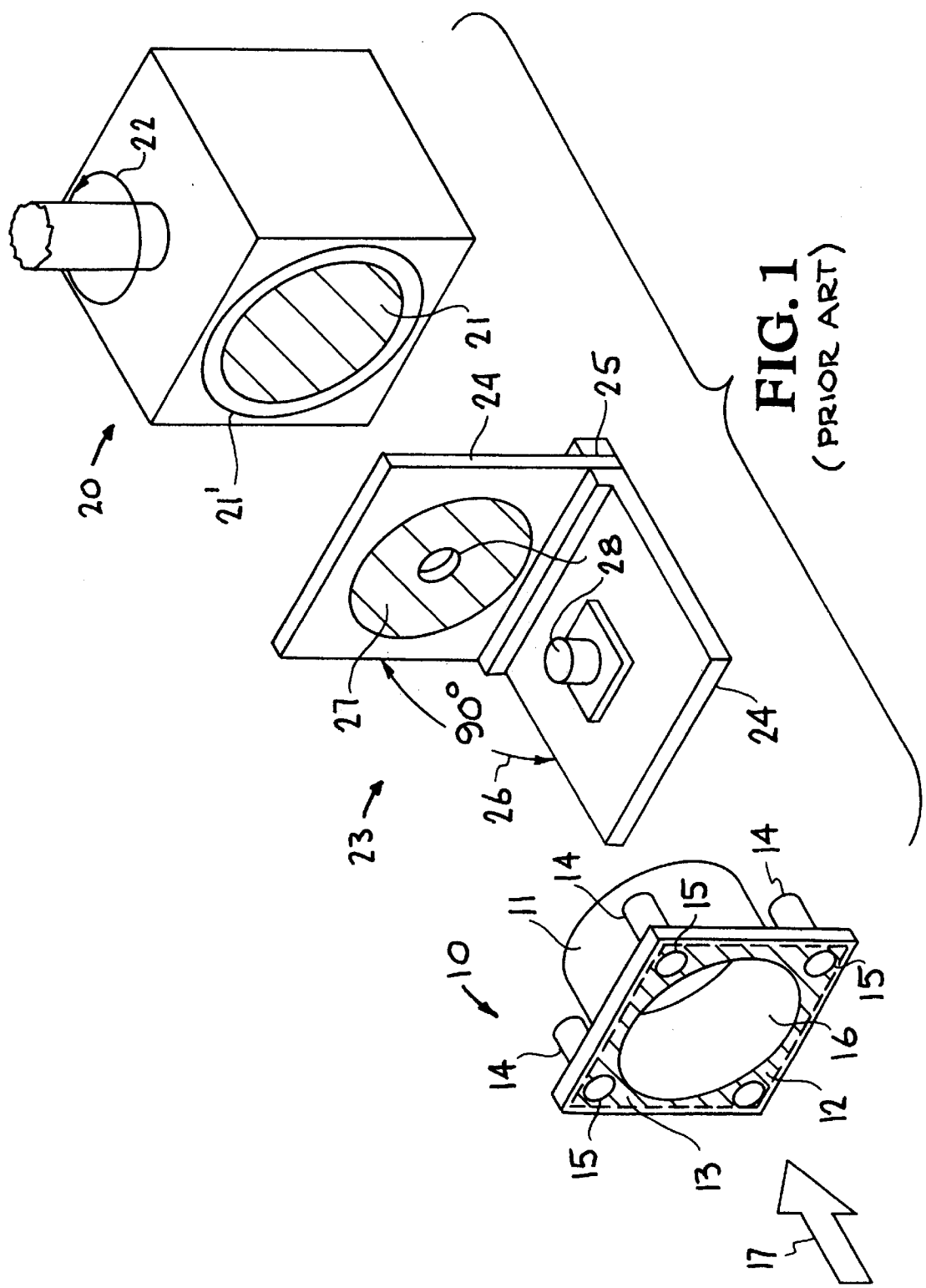
FIG. 1 schematically illustrates an exploded view of a prior art Faraday cup array for ion implantation dose measurement and monitoring.

FIG. 1 schematically illustrates an exploded view of a typical prior art Faraday cup assembly or array for ion beam implementation in combination with a research tube containing a substrate and a movable Faraday flag. As shown, the Faraday cup assembly generally indicated at 10 basically includes a mounting ring or member 11, a mask 12, a scanned area on the mask 13, four Faraday cups 14 having openings 15, and an aperture 16 through which an ion beam 17 passes. The research cube generally. indicated at 20 includes a one or more substrates or wafers 21 within a scanned area 21', and can be rotated as indicated by arrow 22. The Faraday flag generally indicated at 23 includes a plate 24 hinged at 25 to enable plate 24 to be movable over a 90° swing as indicated by arrow 26, with plate 24 in the upright or setup position containing a scanned area 27 having a Faraday cup 28 therein, and the Faraday flag 23 allows setup, as indicated by legend, of the implantation conditions while precluding implantation of the wafers or substrates 21. Moving the movable plate 24 to the implant or lowered position, indicated by legend, a portion of the scanned ion beam 17 passes through aperture 16 of Faraday cup assembly 10, and is projected onto wafers or substrates 21 of research cube 20 for ion implantation thereof. As known in the art, the four Faraday cups 14 are used for determining the dose of ions (i.e., ion,is/cm$^2$) delivered to one or more substrates or wafers 21, and for monitoring the uniformity of the dose delivered to the substrates 21, with the four Faraday cups located at the corners of an ion beam raster or scanned pattern (square or rectangular) and the aperture 16 allows a central region of the raster pattern to be projected onto the substrate or substrates.

Figure 2:
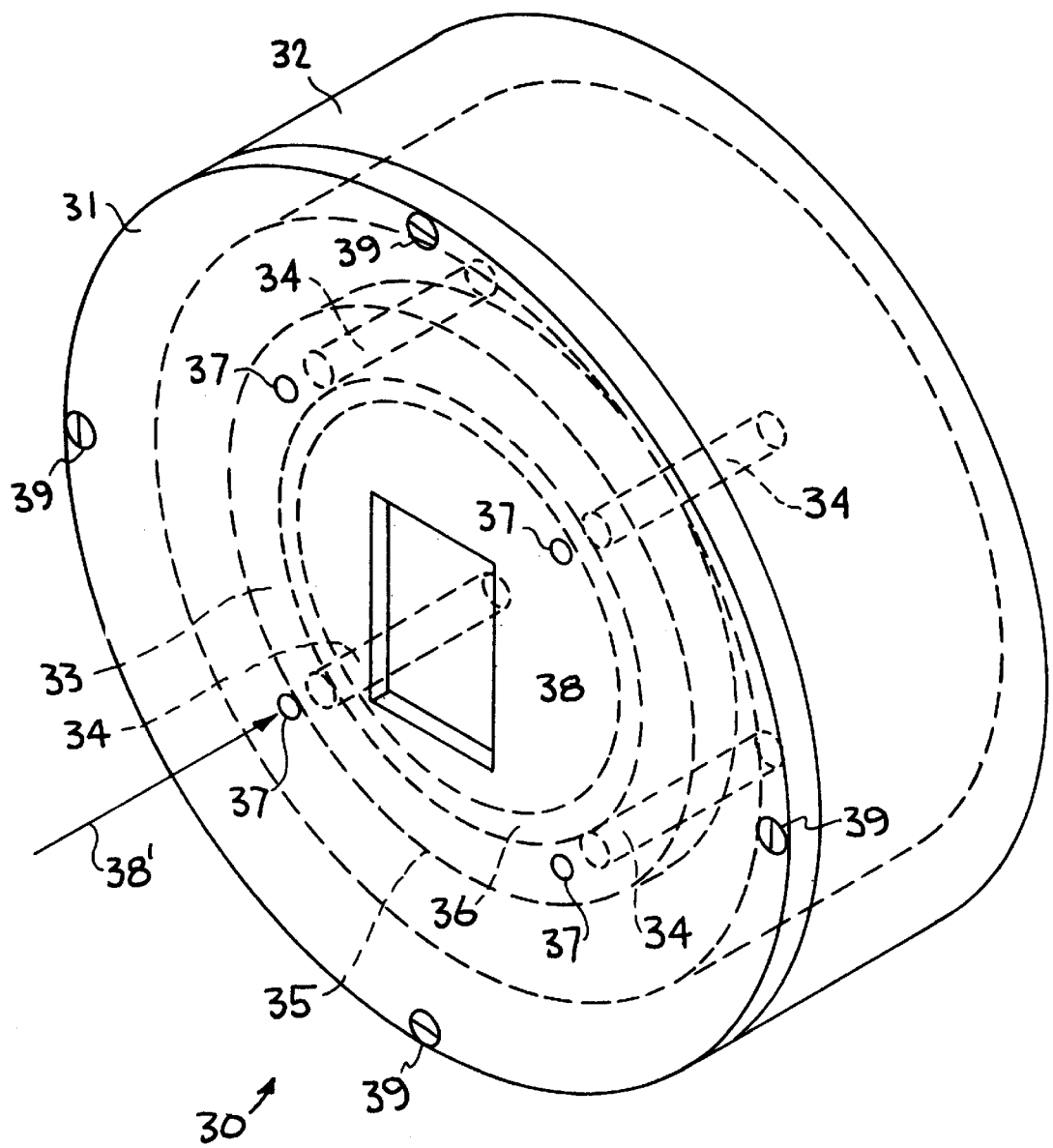
FIG. 2 illustrates an embodiment of a Faraday cup assembly designed to fit inside a tube.
Figure 3:
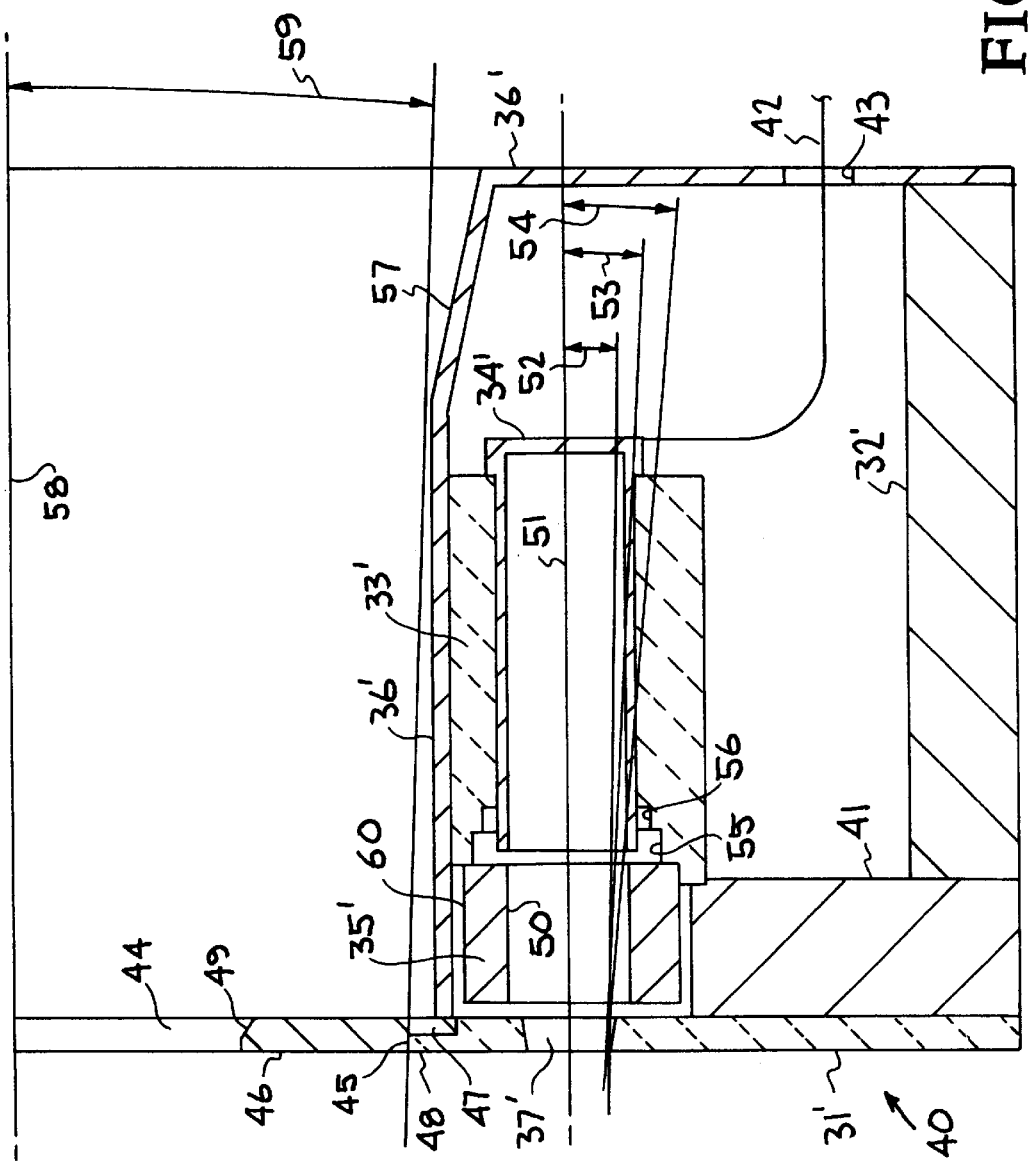
FIG. 3 is a partial cross-sectional view of an embodiment of a Faraday cup assembly similar to FIG. 2 and incorporating the insertable plate for defining the aperture area.

FIGS. 2 and 3 illustrate an embodiment of a complete Faraday cup assembly or array designed to fit inside a tube. Mountings designed for other placements are obvious. This embodiment of, the Faraday cup assembly, generally indicated at 30, consists of the following six (6) major components; a mask 31, a mounting ring 32, an isolation cup holder 33, Faraday cups 34, a bias ring 35, and a cup shield 36. The mask 31 which may be composed of electrically conductive material, such as aluminum and graphite, defines the sizes of apertures 37 for the Faraday cups 34 and the maximum size of the irradiation defining apertures 38 of a square configuration but may be rectangular, etc., through which ion beam axis 38' passes, and shields the Faraday cups 34 from extraneous ion bombardment and electrical signals. The mounting ring 32 which may be composed of electrically conductive structural material such as Al alloys, stainless steel, etc., shields the Faraday cups 34 from extraneous electrical signals and has screws 39 to fix the components of the Faraday cup assembly inside a tube. The isolation cup holder 33, which may be composed of MACOR ceramic, alumina or other electrically isolating dielectric material, electrically isolates the four Faraday cups 34 from the rest of the structure. The Faraday cups 34 which may be composed of electrically conductive material, such as stainless steel, Al alloys, tantalum, etc. are mounted in the cup holder 33. The bias ring 35, may be composed of electrically conductive material such as stainless steel land Al alloys, is biased, for example, at about a –300V to preclude low energy electrons from passing through the cup defining aperture 37, and entering the Faraday cups 34 and to assure proper collection of low energy electrons generated in the Faraday cups 34. The cup shield 36 shields the Faraday cups 34 from ion and electron bombardment, either direct or after the ions hit the substrates, such as 21 in FIG. 1, located behind the Faraday cup assembly 30. The mask 31, mounting ring 32, bias ring 35, cup shield 33, and the Faraday cups 34 should be fabricated from electrically conductive materials.

FIG. 3 is a partial, cross-sectional view of an embodiment of a Faraday cup assembly or array, such as illustrated in FIG. 2, which incorporates the means of the present invention for varying the aperture area of the assembly without changing the locations of the Faraday cups. The aperture area varying means comprises an insertable plate that defines the aperture of the Faraday cup assembly. Note that FIG. 3 illustrates only a section of the Faraday cup assembly from a center line, such as ion beam axis 38' of FIG. 2, and only shows one Faraday cup. Components of FIG. 3 similar to components of FIG. 2 are given corresponding reference numerals. As shown, the Faraday cup assembly or array, generally indicated at 40 is composed of the same major components as FIG. 2 which includes a mask 31', a mounting ring 32', an electrically isolating cup holder 33', a Faraday cup 34' having a cup defining aperture 37' with a tapered hole, a bias ring 35', and a cup shield 36'. All the components but the cup holder are constructed of electrically conductive materials. A spacer ring 41 is located intermediate to the mask 31' and the mounting ring 32', extends around the bias ring 35, and may be composed of electrically conductive materials such as stainless steel and Al alloys. A signal wire 42 connected to Faraday cup 34' extends through an opening 43 in cup shield 36'. The irradiation defining aperture 44 includes a maximum aperture edge 45 and has therein a removable aperture insert (insertable plate or member) 46 which includes a stepped edge 47 which is removably inserted to a matching edge 48 of mask 31'. The aperture insert 46 may be constructed of electrically conductive material such as graphite and Al alloys, and has an opening edge 49 which may define a variety of different configurations and sizes, so as to be easily scaleable to aperture areas of <1 cm$^2$ to >750 cm$^2$.

Also, the components of the Faraday cup assembly 40 of FIG. 3 are constructed of materials which are UHV compatible thus enabling use in UHV applications. By the present invention, the irradiation or implantation pattern on the substrate or wafers can be varied by just installing the appropriate aperture inserts and, yet, the correct dosimetry will still be achieved by the same Faraday cups because the raster pattern will include the Faraday cups and all areas inside the cups.

The Faraday cup aperture 37' is usually chosen to be comparable to the ion beam diameter. The diameter of the holes 50 in the bias ring 35' that are aligning with the Faraday cup axis 51 should be essentially the same as the thickness of the bias ring to ensure that the applied potential (e.g., –300V) occurs on axis 51 at the center of the bias ring hole 50, which means that up to 300 eV electrons are precluded from entering or leaving the Faraday cups 34'. The maximum angle of the rastered beam with the normal to the mask is used to select the diameter of the holes 50 in the bias ring 35'. For example, in FIG. 3, the diameter of the holes 50 were chosen to ensure that ions rastered at angles, as indicated by arrows 52, 53 and 54, of up to 5° could pass into the Faraday cups 34' without scattering (and changing charge) on the inside of the hole 50 of the bias ring 35'. The inside diameter of the Faraday cups 34' should be chosen to be essentially the same as the diameter of the holes 50 in the bias ring 35', and the inside length of the Faraday cups 34' should equal one to a few times the inside diameter of the cups. The double counter bores indicated as 55–56 in the cup holder 33' (preferably composed of MACOR ceramic) near the top of the Faraday cups are required to electrically isolate the Faraday cup from surface leakage current resulting from the potential applied to the bias ring 35'. Such double counter bores 55–56 forces the electrons creating the surface leakage to make abrupt directional changes. Consequently, the surface leakage currents are restricted to values much smaller than the ion beam current even when the time-averaged beam current is as small as 10$^{-12}$A.

The Faraday cups 34' and the cup holder 33' must fit inside the cup shield 36' which has an inside diameter and shape to allow the ions to pass by without scattering from the cup shield and then impinging on the substrate. In FIG. 3, an inner end 57 of cup shield 36' is tapered to allow for passage of rastered ions at an angle of 2° from centerline 58 as indicated at arrow 59. Similarly, the inside diameter of the projection aperture or hole 60 in the bias ring 35' must be large enough to ensure that no ions scatter from this diameter even for the maximum aperture size.

It has thus been shown that the present invention provides a means for improving Faraday cup arrays by extending the sensitivity range, providing the irradiation defining aperture with a varying area whereby its size is easily scaleable, and can be utilized for UHV applications. The sensitivity range is extended to from below $10^6$ to $10^{18}$ ions/cm$^2$, the aperture area is scaleable between <1 cm$^2$ and >750 cm$^2$, and is constructed of materials which are UHV-compatible. The invention is structurally simple land utilizes an insertable plate in the irradiation defining aperture whereby the aperture area can be easily changed without changing the positions of the Faraday cups.

While an embodiment of the invention has been illustrated and described, and specific materials, parameters, etc. have been described, such are not intended to be limiting. Modifications and changes may become apparent to those skilled in the art, and it is intended that the invention be limited only by the scope of the appended claims.

What is claimed is:

1. In a Faraday cup array having an irradiation defining aperture and a plurality of Faraday cups positioned about said aperture, the improvement comprising:

means for varying the aperture area between <1 cm$^2$ and >750 cm$^2$ without changing the position of the plurality of Faraday cups, said means comprising a removable, insertable member having an opening therein.

2. The improvement of claim 1, wherein said opening of said removable, insertable member defining said aperture area is scaleable from <1 cm$^2$ and >750 cm$^2$.

3. The improvement of claim 1, wherein said removable, insertable member includes a peripheral or stepped edge by which it is retained in said aperture.

4. The improvement of claim 1, wherein said removable, insertable member is constructed of material selected from the group consisting of graphite, molybdenum and Al alloys.

5. A versatile, high-sensitivity Faraday cup assembly for dosimetry and uniformity measurements during ion implantation or electron irradiation of materials, comprising:

a mounting ring, a mask secured to said mounting ring and having an irradiation defining aperture therein, and a plurality of Faraday cup defining apertures;

a plurality of Faraday cups located within said mounting ring, positioned about said aperture, and in alignment with said plurality of Faraday cup defining apertures;

a holder for said Faraday cups, a bias ring adjacent said Faraday cups, a cup shield positioned adjacent said holder and said bias ring, and a removable insert positioned in said aperture and having an opening therein, whereby said opening in said removable insert defines an area of said aperture scaleable between <1 cm$^2$ and >750 cm$^2$.

6. The assembly of claim 5 having a sensitivity in the range from below $10^6$ ions/cm$^2$ to $10^{18}$ ions/cm$^2$.

7. The assembly of claim 5, wherein said removable insert is constructed to include said opening therein to enable an aperture area of <1 cm$^2$ and >750 cm$^2$.

8. The assembly of claim 5, additionally including a spacer ring located intermediate said mounting ring and said mask, and extending around said bias ring.

9. The assembly of claim 5, wherein said holder for said Faraday cups includes double counter bores in an end adjacent said bias ring.

10. The assembly of claim 5, wherein said cup shield includes a tapered section.

11. The assembly of claim 5, wherein said removable insert includes a peripheral edge for mounting in said mask.

12. The assembly of claim 5, wherein said opening in said, removable insert may be composed of different configurations and of different areas.

13. The assembly of claim 5, wherein each of said mounting ring, mask, bias ring, cup holder, and the Faraday cups is constructed of electrically conductive material.

14. The assembly of claim 5, wherein said mounting ring is composed of stainless steel, said mask is composed of graphite, said cup holder is composed of MACOR ceramic, and said Faraday cups are composed of tantalum or stainless steel.

15. A method for varying an irradiation defining aperture area of a Faraday cup array between <1 cm$^2$ and >750 cm$^2$ without changing the position of the Faraday cups, comprising:

providing a removable, insertable member with an opening of a desired configuration and area, and inserting the member in the irradiation defining aperture of the Faraday cup array.

16. The method of claim 15, wherein providing the member with an opening is carried out to enable an area of the opening to vary from <1 cm$^2$ to >750 cm$^2$.

17. The method of claim 15, additionally including providing the member with a peripheral or stepped edge of reduced thickness for retaining the member in the irradiation defining aperture.

18. The method of claim 15, additionally including forming the member from materials selected from the group consisting of graphite, molybdenum, and Al alloys.

* * * * *